United States Patent
Gelsomini et al.

(10) Patent No.: US 6,278,616 B1
(45) Date of Patent: Aug. 21, 2001

(54) MODIFYING MEMORY DEVICE ORGANIZATION IN HIGH DENSITY PACKAGES

(75) Inventors: Tito Gelsomini, Plano, TX (US); Chee Kiang Yew; Yong Khim Swee, both of Singapore (SG)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/111,429

(22) Filed: Jul. 7, 1998

(51) Int. Cl.7 ........................................... H05K 1/11
(52) U.S. Cl. ..................... 361/803; 257/686; 365/51; 365/63; 365/230.03; 438/109
(58) Field of Search ........................ 361/778, 790, 361/803; 257/686, 723, 777; 365/51, 52, 63, 230.03; 439/68, 69; 438/109

(56) References Cited

U.S. PATENT DOCUMENTS

| | | | |
|---|---|---|---|
| Re. 36,916 | * 10/2000 | Moshayedi | 257/723 |
| 4,398,235 | * 8/1983 | Lutz et al. | 257/686 |
| 4,956,694 | * 9/1990 | Eide | 257/686 |
| 5,130,894 | * 7/1992 | Miller | 361/803 |
| 5,208,782 | * 5/1993 | Sakuta et al. | 365/51 |
| 5,334,875 | * 8/1994 | Sugano et al. | 257/686 |
| 5,561,622 | * 10/1996 | Bertin et al. | 365/51 |
| 5,585,675 | * 12/1996 | Knopf | 257/686 |
| 5,612,570 | * 3/1997 | Eide et al. | 257/686 |
| 5,956,233 | * 9/1999 | Yew et al. | 257/686 |
| 6,034,438 | * 3/2000 | Petersen | 257/686 |
| 6,072,233 | * 6/2000 | Corisis et al. | 257/686 |

* cited by examiner

*Primary Examiner*—Jeffrey Gaffin
*Assistant Examiner*—John B. Vigushin
(74) *Attorney, Agent, or Firm*—Gary C. Honeycutt; Fred Telecky; Arthur I. Navarro

(57) ABSTRACT

A high density memory module is disclosed comprising a first packaged integrated circuit memory device having therein a first electrically insulating carrier and a first conductive routing pattern integral with said first carrier, and at least a first semiconductor circuit chip; a second packaged integrated circuit memory device electrically connected to said first device, wherein said first and second devices form a module; said second packaged integrated circuit device having therein a second electrically insulating carrier and second conductive routing pattern integral with said second carrier, and at least a second semiconductor circuit chip; and said second conductive routing pattern including means for modifying the architectural organization of said module.

22 Claims, 7 Drawing Sheets

MODIFYING MEMORY DEVICE ORGANIZATION IN HIGH DENSITY PACKAGES

The present invention relates in general to the field of semiconductor integrated circuit assembly and packages and more specifically to substantially flat packages forming a set such that the organization of memory chips is modified, and a method for the fabrication.

BACKGROUND OF THE INVENTION

The trend in semiconductor technology to double the functional complexity of its products every 18 months (Moore's "law"), which is still valid today after having dominated the industry for the last three decades, has several implicit consequences. First, the cost per functional unit should drop with each generation of complexity so that the cost of the product with its doubled functionality would increase only slightly. Second, the higher product complexity should largely be achieved by shrinking the feature sizes of the chip components while holding the package dimensions constant; preferably, even the packages should shrink. Third, the increased functional complexity should be parallelled by an equivalent increase in reliability of the product. And fourth, but not least, the best financial profit rewards were held out for the ones who were ahead in the marketplace in reaching the complexity goal together with offering the most flexible products for application.

For semiconductor memory devices, historically the time span of at least three years has been needed between two generations of memory families. The new generation offers a four times larger memory capacity compared to the preceeding generation. Again, shrinking circuit feature sizes and more complex memory hierarchies have been the prerequisite of the new product generation—at high development cost for chip design and fabrication processes, coupled with very expensive investment in costly new manufacturing equipment.

A number of technical advances have recently been achieved in an effort to obtain an advantage in this competitive marketplace. Within the semiconductor memory product families, one of the most promising concepts for shrinking the package outline and thus consuming less area when the device is mounted onto the circuit board, has been the so-called "board-on-chip" design replacing the traditional metallic leadframe. Patent application Ser. No. 9702348-5 entitled "Board on Chip—Ball Grid Array Chip Size Package" has been filed by Texas Instruments in Singapore on Jul. 2, 1997. This patent application for memory products successfully approaches the problem of reducing the area requirement by replacing the traditional leaded package design with a solder ball concept. In addition, it offers a reduction in the height requirement by replacing the leadframe-on-chip assembly with a thinner and more flexible board-on-chip design. An improvement in device height reduction has recently been submitted to Singapore in a patent application entitled "Thin Chip-Size Integrated Circuit Package and Method of Fabrication" (TI—25689, submitted in December 1997). It describes a modified layout of the electrically conductive strips integral with the electrically insulating board within the device in order to achive a lower loop height of the metal wires in the bonding process.

The newly available board-on-chip memory devices have been exploited for assembling so-called "modules" with two or more devices stacked on top of each other and soldered together by reflowing their solder balls or solder columns. Patent application Ser. No. 9703952-3 entitled "High Density Three Dimensional Board-on-Chip Cube" has been filed by Texas Instruments in Singapore on Nov. 5, 1997, and patent application Ser. No. 9703963-0 entitled "High Density 3-Dimensional Stacked Ball Grid Array Integrated Circuit Module" has been filed by Texas Instruments in Singapore on Nov. 6, 1997. A new modification using thin board-on-chip devices entitled "Thin Board-on-Chip Integrated Circuit Unit" has been submitted by Texas Instruments in Singapore, also in 1997.

While the modules of stacked memory devices achieve more memory bits without shrinking the feature sizes of the chip components, they fail to fully utilize the product complexity due to lack of simultaneous modification of the architectural organization of the module. Consequently, a need has arisen for package designs and methods of device fabrication that provide simple, low-cost processes for memory modules of simultaneously increased memory capacity and architectural organization. At the same time, the goals of small product outline and low height limitation should undergo further refinements. Preferably, these improvements should be accomplished using the installed equipment base so that no investment in new manufacturing machines is needed.

SUMMARY OF THE INVENTION

The present invention comprises a high density memory module and a method for fabricating the enabling parts of small outline memory packages whereby the capacity and the organization of the assembled module is multiplied. The present invention also defines the design rules for the pattern of electrically conductive strips integral to the electrically insulating carriers as constituent parts of the memory device packages.

The present invention applies certain rules taken from mathematical group theory of logic arrangement. When two semiconductor devices, each of which have electrical inputs/outputs, are to be combined into a module so that the inputs/outputs of the module acquires an exlusive combination of the inputsloutputs of the two constituent devices, the rule of "exclusive OR" is employed. The invention accomplishes the modification of the architectural organization of the module by designing the electrical routing inside the device packages so that their electrical inputs/outputs are not shared.

It is an object of the present invention to leapfrog to the memory capacity and organization of the next generation of products without redesigning the semiconductor circuit chips.

Another object of the present invention is to provide a design method of electrical connections, as well as a low-cost process for fabrication, for parts of small outline memory packages suitable for producing stacked memory modules.

Another object of the present invention is to introduce package design concepts for semiconductor memory devices which are flexible, so that they can be applied to several families of memory products, and are general, so that they can be applied to several future generations of products.

Another object of the present invention is to provide a low-cost method and system for assembling chip-size packaged devices into thin overall-profile modules.

Another object of the present invention is to provide reliability assurance for the finished product through in-process control at no extra cost.

Another object of the present invention is to minimize the cost of capital investment and to use the installed fabrication equipment base.

These objects have been achieved by the package design of the invention and a mass production process. Various modifications have been employed for the outline of the package parts and the assembly of packages and modules.

In one embodiment of the invention, the selection rules for the electrically conductive patterns integral to the electrically insulating carriers of 64 Mbit DRAM packages are described, for chips in by-4 organization. When two complimentary devices are combined in accordance with the invention, a 128 Mbit memory module in by-8 organization is created.

In another embodiment of the invention, the selection rules for the electrically conductive patterns integral to the electrically insulating carriers of 64 Mbit DRAM packages are described, for chips in by-4 organization. When four complimentary devices are combined in accordance with the invention, a 256 Mbit memory module in by-16 organization is created.

In other embodiments of the invention, modules of eight devices in by-4 organization are combined according to the invention to create eight-times the memory capacity in by-32 organization.

Other embodiments of the invention illustrate the stacking of low profile, high density modules.

The technical advance represented by the invention, as well as the objects thereof, will become apparent from the following description of the preferred embodiments of the invention, when considered in conjunction with the accompanying drawings and the novel features set forth in the appended claims.

BRIEF DESCRIPTION OF THE DRAWINGS

FIG. 1 is a simplified and schematic cross sectional view of a module made of two board-on-chip ball-grid array packages.

FIG. 2 is a simplified and schematic cross sectional view of a module made of four board-on-chip ball grid array packages.

DETAILED DESCRIPTION OF THE PREFERRED EMBODIMENTS

The present invention is related to high frequency integrated circuits having both a low profile and a small outline package, and are assembled using existing manufacturing equipment. The present invention is further related to semiconductor packages of the board-on-chip design of the ball-grid array family, which has been introduced by Texas Instruments under the trademark name BOC-BGA™. This package design enables a plurality of packages to be electrically connected as well as physically stacked together as modules for high speed performance and for meeting the space constraints imposed on many semiconductor leadership products. As defined herein, the term "profile" refers to the thickness or height of the integrated circuit package or module. This definition does include the height of the solder balls or solder columns before they are reflowed in board attachment.

As defined herein, the term "packaged device" refers both to a semiconductor chip having been assembled for electrical connection, and to an assembled semiconductor chip being at least partially encapsulated. The term "package" refers to all entities of a semiconductor device other than the chip itself.

The present invention meets the requirement for space constraint of continually shrinking applications such as cellular communications, pagers, hard disk drives, laptop computers and medical instrumentation. The present invention also helps to maximize high speed performance and addresses the problems associated with the electronic capacity of the chip assembly. The principles of the present invention may be incorporated into dynamic random-access memories (DRAM), synchronous DRAM (SDRAM), static random-access memories (SRAM), erasable programmable read-only memories (EPROM), some logic circuits (LOGIC) and many other integrated circuit components.

While the making and using of various embodiments of the present invention are discussed in detail below, it should be appreciated that the present invention provides many applicable inventive concepts which can be embodied in a wide variety of specific contexts. The specific embodiments discussed herein are merely illustrative of specific ways to make and use the invention and do not delimit the scope of the invention. The impact of the present invention can be most easily appreciated by highlighting the shortcomings of the known technology.

Figure 1:
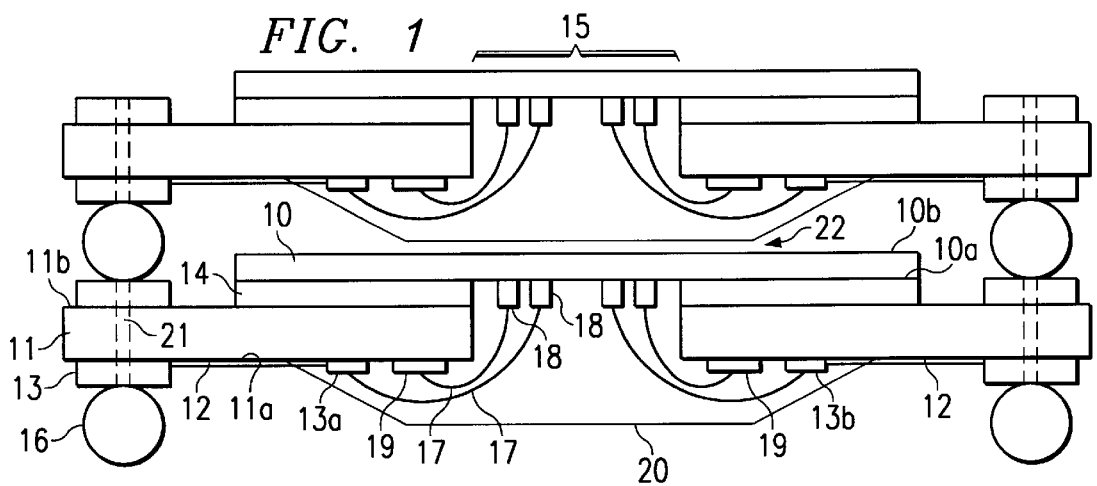
FIGS. 1 and 2 refer to prior art.

As one embodiment of the invention, FIG. 1 shows the simplified and schematic cross section of a module formed by attaching two board-on-chip ball-grid array packages by means of solder balls. Each package comprises a semiconductor chip 10, which can be, for example, a silicon integrated circuit component such as a DRAM chip, having typically a thickness range from 0.25 to 0.4 mm. The semiconductor chip 10 has a circuit surface 10a and a back surface 10b. Each package further has an electrically insulating board 11, referred to as the "carrier", having a first surface 11a and a second surface 11b. Furthermore, each package has a plurality of conductive routing strips 12, deposited on the first surface 11a of carrier 11, and thus being integral with carrier 11. These routing strips form a "pattern" and constitute a network of connections for electrical ground, power and signal lines. In addition, there is a plurality of contact pads 13, 13a and 13b deposited on the first surface 11a of carrier 11.

Carrier 11 has the silicon chip 10 attached to its second surface 11b such that this second surface 11b faces the circuit surface 10a of chip 10. The attachment between carrier 11 and chip 10 is enabled by an adhesive layer 14. Carrier 11 is made of electrically insulating material such as the epoxy resin FR-4. It has typically a thickness of 0.3 mm. Alternatively, a polyimide-based carrier may be used. The adhesive layer 14 may be made of, for example, a double-sided adhesive polyimide tape.

Carrier 11 of each package has an opening 15. This opening is surrounded by contact pads which form a first row of pads 13a adjacent to one side of opening 15 and a second row of pads 13b adjacent to the opposite side of opening 15. These rows of contact pads 13a and 13b receive the stitch ends of the whisker wires 17. These wires connect to the chip bonding pads 18, arranged generally in the central area of chip 10. Contact pads 13 are positioned close to and along the peripheral edges of carrier 11. Disposed on these contact pads 13 are solder balls 16 which are needed for combining two or more packages into a module, and for attaching the package to the final customer application boards.

As can be seen in FIG. 1, a pair of bus bars 19 is positioned parallel and close to the edges of opening 15. The bus bars are electrically connected to one or more of the pads 13. The bus bars may serve, for example, as power supplies or grounds. A number of chip bonding pads 18 are connected to the bus bars 19 by wire bonding 17. If the bus bars are designed as shown in FIG. 1, they have to receive an electrically insulating film wherever signal wire bonding crosses over them, in order to completely eliminate the possibility of an electrical short; however, these insulating layers are expensive and technically undesirable. In other carrier designs which avoid the need for insulations, bus bars 19 are located remote from opening 15, and positioned between contact pads 13 and the peripheral edge of carrier 11.

The whisker wires 17 (usually gold, gold alloy, or copper) are bonded after the semiconductor chip 10 has been adhered to the carrier 11. Known technology allows a pitch of gold balls between 70 and 100 $\mu$m. Moving the bonder capillary containing the gold wire in a pre-determined and computer-controlled manner through the air will create a wire looping of exactly defined shape. For instance, recent technical advances allow the formation of sequential paths of different looping heights. With this capability, wire loops high enough for safely crossing the bus bars can be manufactured.

After all the bonding pads 18 that require electrical connection to the carrier 11 are connected, the opening 15 is filled with potting or molding material (indicated by line 20 in FIG. 1) up to a height of about 20 to 50 $\mu$m on top of the maximum wire loop height. Consequently, the potting material will rise significantly (sum of loop height and potting height) over the surface 11a of the carrier.

Rather than using wire bonding, the electrical interconnection between the chip bonding pads and the carrier contact pads can also be accomplished by solder balls or solder bumps using flip-chip processing. In this case, the process step of potting or encapsulating may be omitted.

The diameter, or thickness, of the solder balls (or solder column) 16 must exceed the thickness of the potting material 20 extending over surface 11a. Since the high wire looping necessitates significant potting material thickness, the solder balls must have the relatively large diameter of typically between 0.25 and 0.4 mm.

Electrically conductive vias 21 through electrically insulating carrier 11 connect contact pads 13, and often solder balls 16, on both surfaces of carrier 11. With this feature, one package can be attached by soldering to another package in order to form a module, while electrical connections is established between contact pads 13 of each package. Such attachment of packages by soldering is commonly called "stacking". In similar fashion, packages and/or modules can be stacked onto customer circuit boards.

Since semiconductor chip 10 is facing with its circuit side 10a towards carrier 11, when it is attached to carrier 11 by means of adhesive layer 14, is will have its back surface 10b exposed. After stacking a first and a second packaged integrated circuit device to form a module, as shown in FIG. 1, a space 22 is formed between the first and second device. The exposed back surface of the first chip is disposed in this space 22. It is able to dissipate thermal energy, generated by device in operation, through convection and radiation into the ambient. In similar fashion, the exposed chip back surface of the second packaged device can dissipate thermal energy through convection and radiation into the ambient. To that exposed surface, an additional metallic heat sink may be attached (not shown in FIG. 1) in order to maximize the heat dissipation.

When the two individual packaged memory devices are stacked, the resulting module is indeed of "high density"; it occupies an assembly board area not larger than an individual memory device, and exhibits only minimum height.

When both chips 10 in FIG. 1 are memory circuits of the same type, then the mechanical assembly of the module depicted in FIG. 1 is able to double the memory capacity of each individual chip only if the architectural organization of the module is modified so that the electrical inputs/outputs of the first device are not shared by the inputs/outputs of the second device. In prior art, this goal could only be reached
- if the bond diagram of wire connections 17 in the package of the second device were different from the bond diagram of the wire connections in the package of the first device; or alternatively,
- if each chip 10 were designed with different layout for the signal terminals 13a.

Persons skilled in the art of semiconductor manufacturing technology will appreciate the fact that both of these two alternatives are impractical from a logistics standpoint, prone to manufacturing difficulties, and expensive. Consequently, in order to gainfully employ the module of FIG. 1, a new solution for modifying the organization has to be found.

Figure 2:
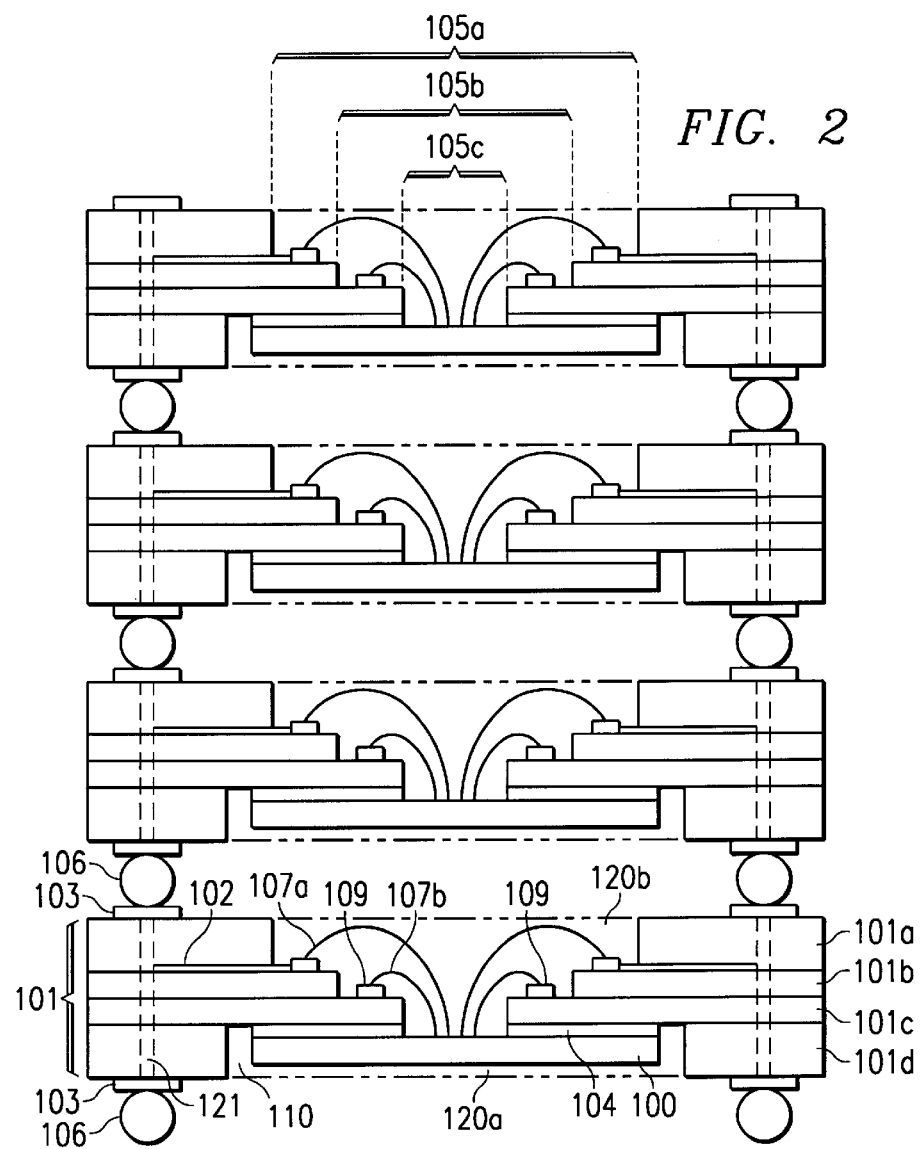

The inadequacy of the known technology is aggravated when a module of four packaged memory circuit devices is assembled as shown in FIG. 2 in an effort to quadruple the memory capacity of each device. FIG. 2 shows the simplified and schematic cross section of a module stacked by means of solder balls. The package of each device is constructed and fabricated similar to the device package described in FIG. 1, but with some modifications in this example. The carrier 101 in the individual package of FIG. 2 includes a cavity 110. Inside this cavity, semiconductor chip 100 is adhered to carrier 101 by means of adhesive layer 104. With chip 100 positioned in cavity 110, it possible, whenever desirable, to cover chip 100 with encapsulating material 120a for protective purposes. Carrier 101 consists of four electrically insulating layers: Layer 101a with a large opening 105a, intermediate layer 101b with a somewhat smaller opening 105b, intermediate layer 101c with a still smaller opening 105c, and layer 101d, which, together with layer 101c, forms the cavity 110 for the semiconductor chip.

The separate layers of carrier 101 allow a simplified, although more expensive, layout of conductive routing strips 102 along the interfaces of the intermediate layers 101a and 101b. These routing strips are electrically connected through vias 121 to contact pads 103, which are located on the exposed surfaces of carrier layer 101a, as well as on the exposed surfaces of carrier layer 101d. Intermediate layer 101c includes a pair of bus bars 109. The bus bars are electrically connected through vias 121 to one or more of the contact pads 103. The bus bars may serve, for example, as power supplies or ground, and it is preferred that one bus bar 109 serve one function, such as a power supply, and the second bus bar 109 serve another function, such as ground. The reason for choosing the more expensive multi-layer design of carrier 101 is the possibility to eliminate the need to insulate the bus bars 109. Additionally, the multi-layer carrier 101 provides a greater process margin for wire bonding.

The whisker wires 107a and 107b are bonded after the seimconductor chip 100 has been adhered to the carrier 101. Wires 107a serve signal connections, and wires 107b serve power and ground connections. The looping spans of both wires 107a and 107b are protected by encapsulating material 120b. This material fills the opening defined by carrier layer 101a and forms a flat surface in line with the exposed surface of layer 101a With the encapsulating material 120b contained, the plurality of solder balls 106 can have a relatively small diameter (usually in the range 0.1 to 0.5 mm, commonly 0.2 mm).

When the four chips 100 in FIG. 2 are memory circuits of the same type, then the mechanical assembly of the module depicted in FIG. 2 is able to quadruple the memory capacity of each individual chip only if the architectural organization of the module is modified such that the electrical inputsloutputs of any of the four devices are not shared by the inputs/outputs of any other of four devices. In prior art, this goal could be reached.

if the bonding diagrams of the wire connections 107a would follow different patterns in each of the four packages; or alternatively, if the chips 100 in each of the four devices had been designed with a different layout for the signal terminals 107a.

Persons skilled in the art of semiconductor manufacturing technology will appreciate the fact that both of these two alternatives are very impractical from a logistics standpoint, prone to manufacturing difficulties, and expensive. Consequently, in order to gainfully employ the module of FIG. 2, a new solution for modifying the organization has to be found.

Figures 3, 4:
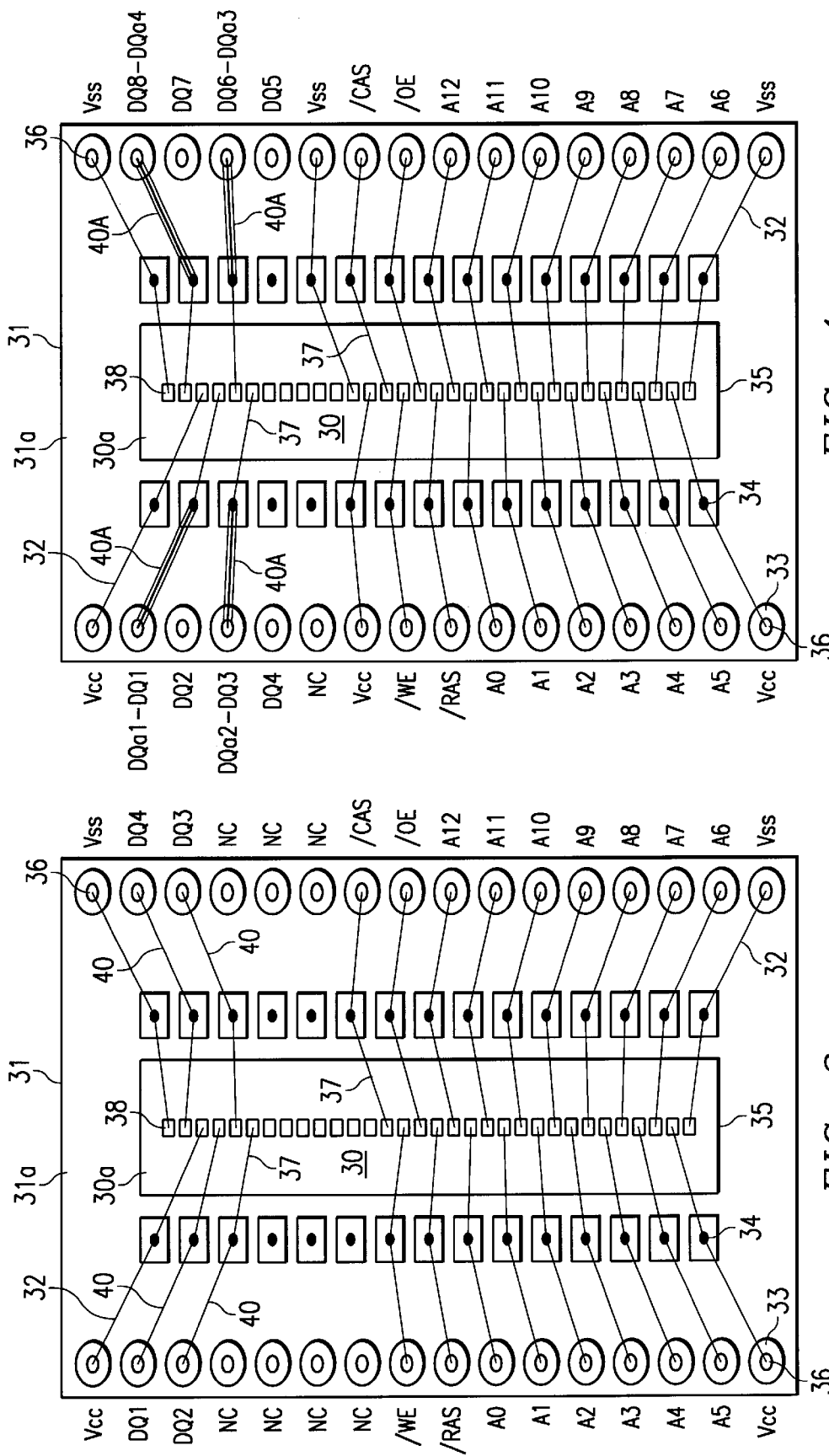
FIG. 3 is a schematic top view of a individual board-on-chip ball-grid array 64 Mbit×4 memory device illustrating the plurality of electrically conductive routing strips integral with the electrically insulating carrier.
FIG. 4 is a schematic top view of a first board-on-chip ball-grid array 64 Mbit×4 memory device illustrating the plurality of electrically conductive pattern integral with the electrically insulating carrier, according to the invention, for connecting into a 128 Mbit×8 module with a second packaged 64 Mbit×4 device (shown in FIG. 5).
Figure 5:
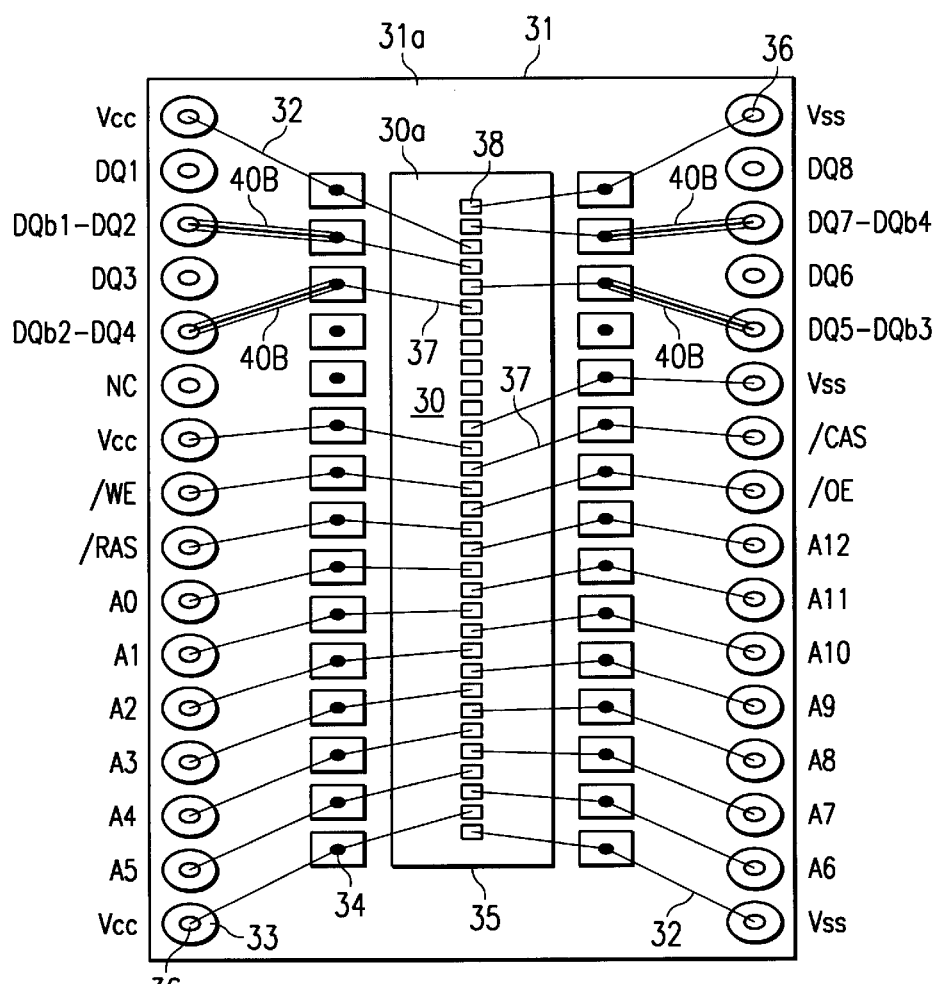
FIG. 5 is a schematic top view of a second board-on-chip ball-grid array 64 Mbit×4 memory device illustrating the plurality of electrically conductive pattern integral with the electrically insulating carrier, according to the invention, for connecting into a 128 Mbit×8 module with a first packaged 64 Mbit×4 device (shown in FIG. 4).

The present invention avoids these difficulties by the following design and process innovations. In addition, since according to the invention neither the bonding diagrams nor the chip designs need to be changed, the present invention applies to centralized bonding pads of the circuit chip as well as to alternate layouts such as bonding pads positioned along the sides of the circuit chip. The invention also applies to devices in which flip-chip processing of solder-bumped chips, rather than wire bonding, is employed in order to connect the chip terminals/bonding pads to the carrier contact pads. Furthermore, the circuit chip may be made of silicon, gallium arsenide, or any other semiconductor material customarily used in electronic device production. The following embodiments are based on the 64 Mbit×4 (also referred to as 16 Mbyte×4) DRAM device, FIG. 3:

FIGS. 4 and 5: two devices combined to form a module of 128 Mbit×8 (also referred to as 16 Mbyte×8), thus doubling the capacity and the organization of each starting device;

FIGS. 7, 8, 9 and 10: four devices combined to form a module of 256 Mbit×16 (also referred to as 16 Mbyte× 16), thus quadrupling the capacity and the organization of each starting device. Even though the invention is described in terms of modules of two or four devices, it is to be understood that also eight, or 16, ore more devices may be stacked to form the module using the strategy for changing the circuit organization described herein. In addition, as will be clearly seen by persons skilled in the art, other starting devices (such as 16 Mbit DRAM, 256 Mbit DRAM, or SRAM, or EPROM devices, etc.) or other organizations than ×4 may be selected as building blocks.

As defined herein, the term "organization" of a memory device refers to the number of inputs/outputs which have to be activated as a group in order to address the memory device. The "organization" "Z" is commonly symbolized by adding "by Z", or "xZ", behind the cell size indicating the memory capacity. For instance, when a 64 Mbit memory capacity is "organized by 4", it is abbreviated as "64 Mbit×4" and means that 4 inputs/outputs have to be activated as a group in order to address the memory device. Another way of expressing the same definition is the statement: A 64 Mbit×4 memory device is organized as 16 million words/bytes of 4 bits each. Similarly: A 128 Mbit×8 memory module is organized as 16 million words/bytes of 8 bits each.

FIG. 3 is a simplified and schematic top view of a board-on-chip ball-grid array 64 Mbit×4 DRAM device (BOC-BGA™). FIG. 3 illustrates the electrically insulating carrier 31 with its opening 35 and its first surface 31a. Through opening 35, part of the circuit surface 30a of semiconductor circuit chip 30 can be seen. Deposited on first surface 31a and integral with carrier 31 is the plurality of electrically conductive routing strips 32. These routing strips form a "pattern" and constitute a network of connections for electrical ground, power an signal lines. In addition, there is a plurality of contact pads 33 and 34 deposited on first surface 31a of carrier 31. On contact pads 33, solder balls 36 are attached, and on contact pads 34, the stitch ends of the bonding wires 37 are welded. The ball ends of wires 37 form intermetallic contacts on the chip bonding pads 38. Contact pads 34 form a first row of pads adjacent to one side of opening 35 and a second row of pads adjacent to the opposite side of opening 35.

In FIG. 3, there are symbols assigned to each of the solder balls pads 33 as the electrical terminals of the device. These symbols are standardized in the industry and defined in the data sheet of the device under discussion. Some symbols communicate universal meaning, for instance, Vss for ground and Vcc for power. Most of the symbols, however, vary from one device type to another device type. The symbol NC stands for "no connection" and indicates that for this solder pad, no routing strip is connecting it to any wire contact pad. It is of crucial importance to the invention that those terminals which serve as electrical inputs/outputs of the device can be rerouted from contact pads 34 (and thus indirectly from chip bond pads 38) to different pads 33 by simply redesigning the pattern of their routing strips, while those terminals which serve electrical signal, ground and power connections stay unchanged. Those critical routing strips are highlighted by reference number 40 in FIG. 3.

The rerouting of routing strips 40 is technically easy and does not add cost to the device. In well known printed wire technology, the routing strips are fabricated by laminating a thin layer of copper over the insulating carrier 31 and masking the desired pattern before etching away the remainder of the copper. Wherever exposed to ambient, a flash of gold may be added on the copper surface for protection. Consequently, a change in the layout pattern of routing strips 40 is simply accomplished by a change of the protective masking used for etching the copper.

FIG. 4 and FIG. 5 display simplified and schematic top views of ball-grid array 64 Mbit×4 (or 16 Mbyte×4) DRAM devices which are identical except for variations of their carriers according to the invention. The intent is to form a module of the devices in FIG. 4 and FIG. 5 such that the module acquires an exclusive combination of the electrical inputs/outputs of the devices in FIG. 3 and FIG. 4. Device features which are identical to those of the device in FIG. 3 are indicated by the same reference numbers as in FIG. 3. The chips are identical; in particular, chip bonding pads 38 stay the same, so does the bonding diagram of wires 37 connecting the bonding pads 38 to the contact pads 34 of the carrier. Also unchanged are the assignment, name and routing pattern of those contact pads 33 of the carrier which serve electrical signal, power and ground connections.

On the other hand, the assignment, name and routing pattern of the electrical inputs/outputs of the device carriers in FIG. 4 and FIG. 5 are changed in order to acquire the exclusive combination of inputs/outputs for the module. Let the device of FIG. 4 be termed "device having carrier A" and the device of FIG. 5 be termed "device having carrier B". The selection rule is based on applying the logic rule of exclusive OR to the electrical inputs/outputs of device having carrier A and device having carrier B. The results of the selection are tabulated in Table 1. While the solder ball (or pin) assignments for input/output remain as defined in the data sheet of 16 Mbyte×8 devices, the names of input/output solder balls and the connecting routes between solder pads and contact pads 34 are modified.

The nomenclature for the solder balls is chosen such that "DQxy—" indicates that the particular solder ball is connected to the contact pad "DQy" in carrier type "x".

TABLE 1

Connecting Routes on Package Carriers Selected by Logic OR Rules

| 16 Mbyte × 8 | Carrier Type A | | Carrier Type B | |
|---|---|---|---|---|
| Ball Assignment | Solder Ball Name | Route to Contact Pad | Solder Ball Name | Route to Contact Pad |
| DQ1 | DQa1-DQ1 | DQ1 | DQ1 | no connection |
| DQ2 | DQ2 | no connection | DQb1-DQ2 | DQ1 |
| DQ3 | DQa2-DQ3 | DQ2 | DQ3 | no connection |
| DQ4 | DQ4 | no connection | DQb2-DQ4 | DQ2 |
| DQ5 | DQ5 | no connection | DQ5-DQb3 | DQ3 |

TABLE 1-continued

Connecting Routes on Package Carriers Selected by Logic OR Rules

| 16 Mbyte × 8 | Carrier Type A | | Carrier Type B | |
|---|---|---|---|---|
| Ball Assignment | Solder Ball Name | Route to Contact Pad | Solder Ball Name | Route to Contact Pad |
| DQ6 | DQ6-DQa3 | DQ3 | DQ6 | no connection |
| DQ7 | DQ7 | no connection | DQ7-DQb4 | DQ4 |
| DQ8 | DQ8-DQa4 | DQ4 | DQ8 | no connection |

Giving the routing connections the reference number 40A in FIG. 4, and the reference number 40B in FIG. 5, the figures display the selected connections together with the names of the respective solder balls. In FIG. 4, the routing strip from DQa1-DQ1 connects to contact pad DQ1; the routing strip from DQa2-DQ3 connects to contact pad DQ2; the routing strip from DQ8-DQa4 connects to contact pad DQ4; and the routing strip from DQ6-DQa3 connects to contact pad DQ3. In FIG. 5, the routing strip from DQb1-DQ2 connects to contact pad DQ1; the routing strip from DQb2-DQ4 connects to contact pad DQ2; the routing strip from DQ7-DQb4 connects to contact pad DQ4; and the routing strip from DQ5-DQb3 connects to contact pad DQ3.

Two packaged 64 Mbit×4 DRAM devices, having identical chips and identical wire bonding diagrams, are electrically connected to form a module. One of these devices has a carrier of type A as in FIG. 4, the other one a carrier of type B as in FIG. 5 (for example, the electrical connection can be achieved by "stacking", i.e., reflowing and joining the respective solder balls). With the connecting routes of carriers type A and type B selected as explained above, the combination of the two devices results in a module of modified architectural organization. The module belongs to the category of 128 Mbit×8, or 16 Mbyte×8 DRAMs. The pattern of the connecting strips in the device with carrier type A and the pattern of the connecting strips in the device with carrier type B have been selected so that the electrical input/output of the module acquires an exlusive combination of the electrical inputs/outputs of the two devices. The routing of the connectings strips in carrier type B compared with carrier type A has been selected so that the electrical inputs/outputs of the device having carrier type B are not shared by the inputs/outputs of the device having carrier type A, while the remainder of the electrical signal and power terminals of the device having carrier type B is shared by the signal and power terminals of the device having carrier type A. As FIGS. 4 and 5 show, the device with carrier type A has one set of DQs not routed, while the device with carrier type B has the complementary set of DQs not routed. On the other hand, A0 to A12,/WE,/OE, /RAS,/CAS, Vcc, and Vss are the same for both devices.

For achieving the electical connection of the device having carrier A with the device having carrier B (for instance, by reflowing the respective solder balls), each terminal is connected with its respective counterpart. When the module thus formed is addressed to perform either the "read" or the "write" function, both the device having carrier A and the device having carrier B are addressed to the same location and perform the same function, but each device deals with only 4-bits (not shared DQs) of the 8-bits byte of the module. Each device is "reading" or "writing" a 4-bits byte, and the cumulative effect on the module is "reading" or "Writing" an 8-bits byte. Consequently, the module is organized ×8, and has a capacity, in 8-bits bytes, equal to that of the individual devices organized ×4.

When the module is addressed, each of the individual devices is addessed at the same time and to the same location. For "read" address: Device having carrier A will read from the addressed locations and get 4 data out from the DQs specified by the connecting pattern of carrier A. Device having carrier B will read from the addressed locations and get 4 data out from the DQs specified by the connecting pattern of carrier B. For "write" address: Device having carrier A will write to the addressed locations and put 4 data out into the DQs specified by the connecting pattern of carrier A. Device having carrier B will write to the addressed locations and put 4 data into the DQs specified by the connecting pattern of carrier B. For both "read" and "write" functions, the DQs complement the 8 inputs/outputs of the module, since the connecting patterns of carriers A an B have been designed as required by a ×8 organization.

Figures 6A, 6B:
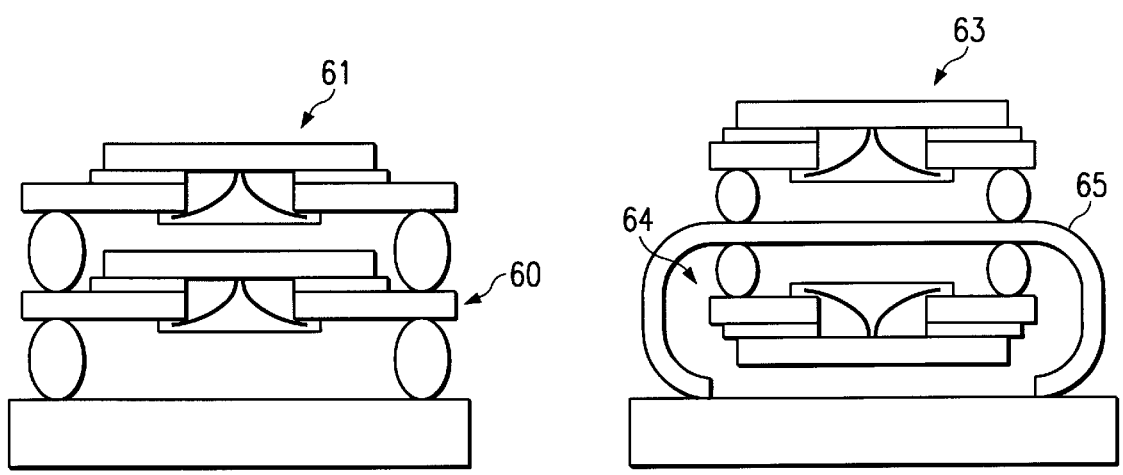
FIG. 6A is a simplified and schematic cross section of a module similar to the module in FIG. 1A.
FIG. 6B is a simplified and schematic cross section of a module using a J-leaded leadfame to connect two individual packaged devices in mirror-like positioning.

FIGS. 6A and 6B compare two embodiments of the invention. FIG. 6A depicts schematically the module described in more detail in FIG. 1. A first packaged memory device generally designated 60 is electrically connected by mechanical stacking to a second packaged memory device generally designated 61 in order to form a module. The design and function of the carriers inside the packaged memory devices 60 and 61 are described in detail in FIG. 4 and 5.

FIG. 6B illustrates schematically another embodiment of the invention. A first packaged memory device generally designated 63 is electrically connected to a second memory device generally designated 64 by means of inserting a metallic leadframe 65, shaped similar to the standard "J-Leaded Small Outline" (SOJ) leadframe, between the two devices. Devices 63 and 64 are attached to leadframe 65 while facing each other in mirror-like position. The respective terminals of the same name, together with their solder balls, are connected by the individual leads of the leadframe. The design and function of the routing patterns of the carriers inside the packaged memory devices 63 and 64 follows the logic rule of exclusive OR analogous to the design of the carriers described in detail in FIGS. 4 and 5. As described in detail above, the result is that one set of 4 DQs is connected only to the contact pads of one device, while the other set of 4 DQs is connected only to the contact pads of the other device.

The embodiment of FIG. 6B is particularly well suited for memory devices in chip-size packages, as indicated by the smaller outline of the carriers inside the packaged devices in FIG. 6B, relative to the outline of the carriers inside the packaged devices in FIG. 6A.

Another embodiment of the invention is illustrated in FIGS. 7, 8, 9 and 10. These FIGS. depict schematically the input/output routing diagrams of four carriers for memory devices of the 64 Mbit×4 family, which are to be connected to a single module of 256 Mbit capacity and ×16 organization, also referred to as 16 Mbyte×16. The cross section of an example of such four-device module is shown schematically in FIG. 2, comprising four board-on-chip ball-grid array devices. According to the invention, the chips in all four devices remain the standard 64 Mbit×4 (also referred to as 16 Mbyte×4) DRAM chips, and the bonding diagrams of the wires 77 (see FIGS. 7 to 10) from the chip bonding pads to the carrier contact pads remain unchanged in all four devices.

Figure 7:
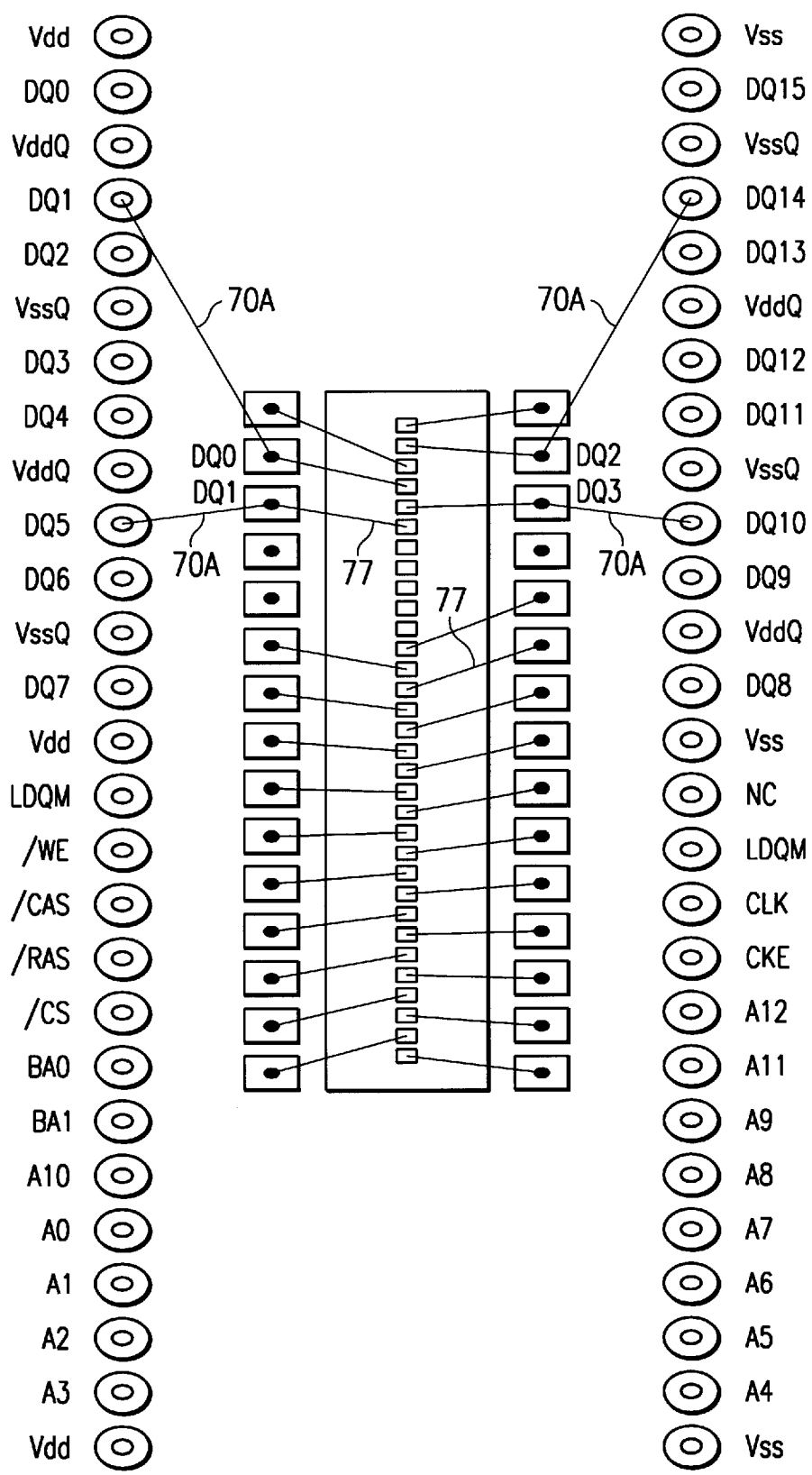
FIG. 7 is a schematic input/output routing diagram of the first of four 64 Mbit×4 packaged devices to be connected to a 256 Mbit×16 module according to the invention.
Figure 8:
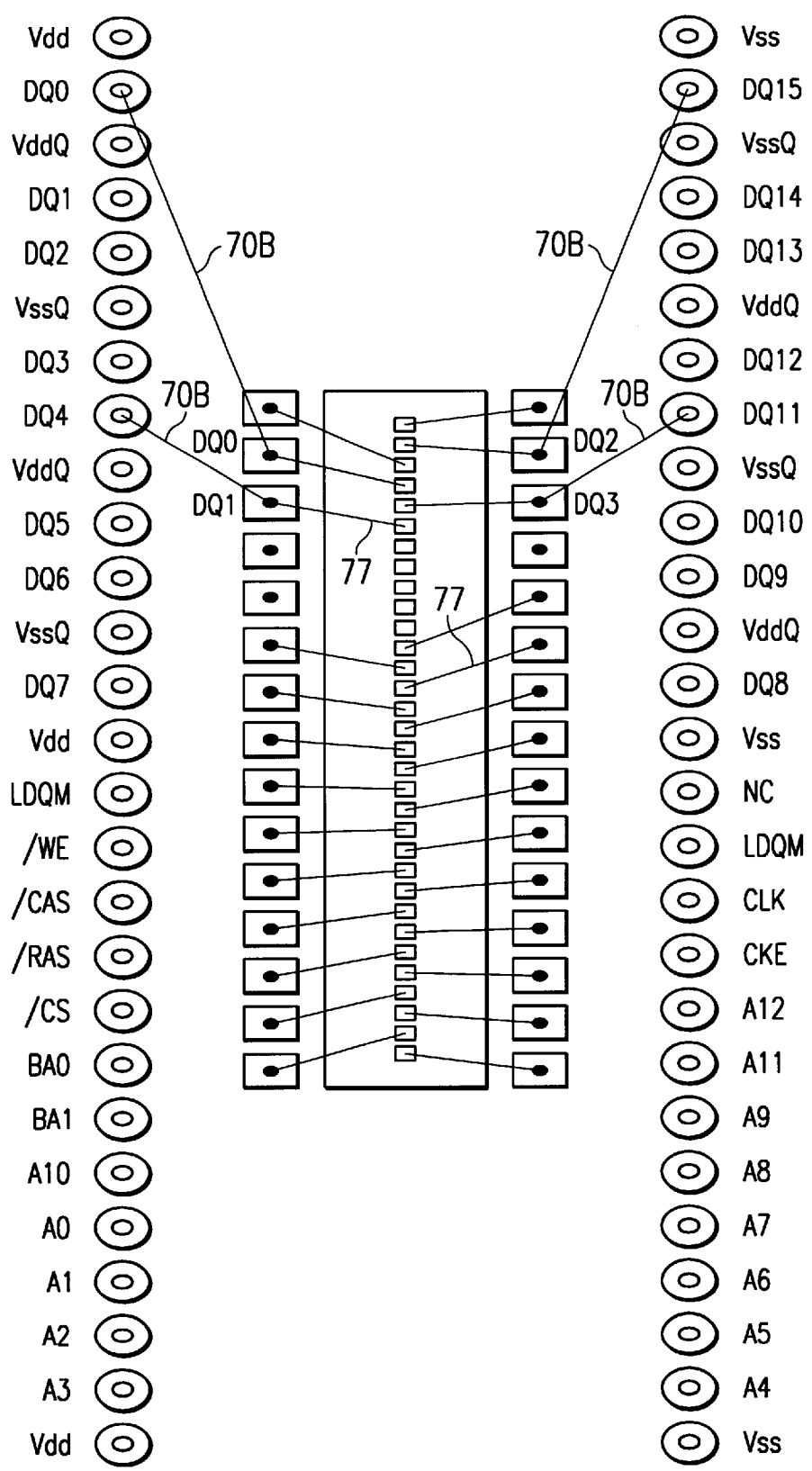
FIG. 8 is a schematic input/output routing diagram of the second of four 64 Mbit×4 packaged devices to be connected to a 256 Mbit×16 module according to the invention.
Figure 9:
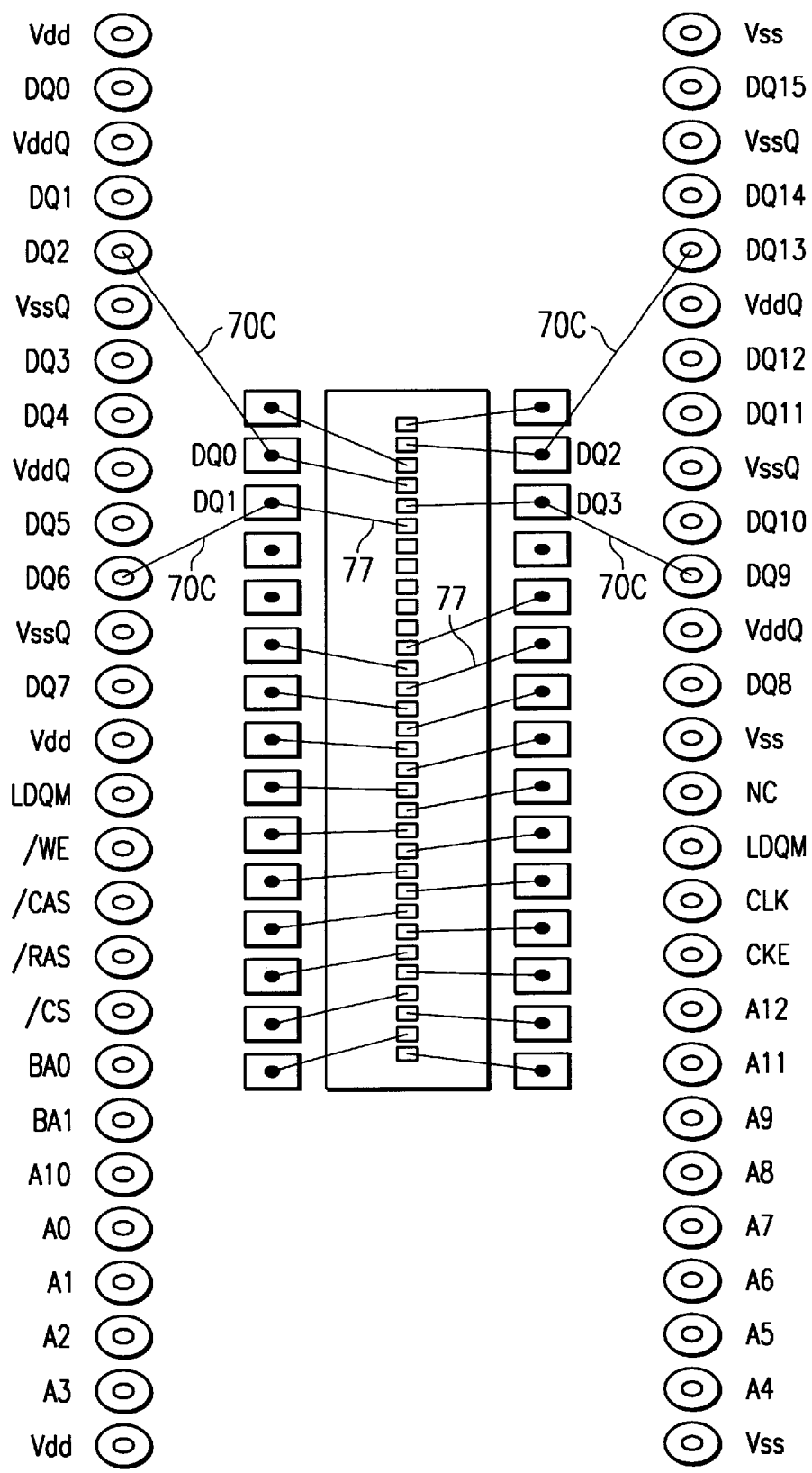
FIG. 9 is a schematic input/output routing diagram of the third of four 64 Mbit×4 packaged devices to be connected to a 256 Mbit×16 module according to the invention.
Figure 10:
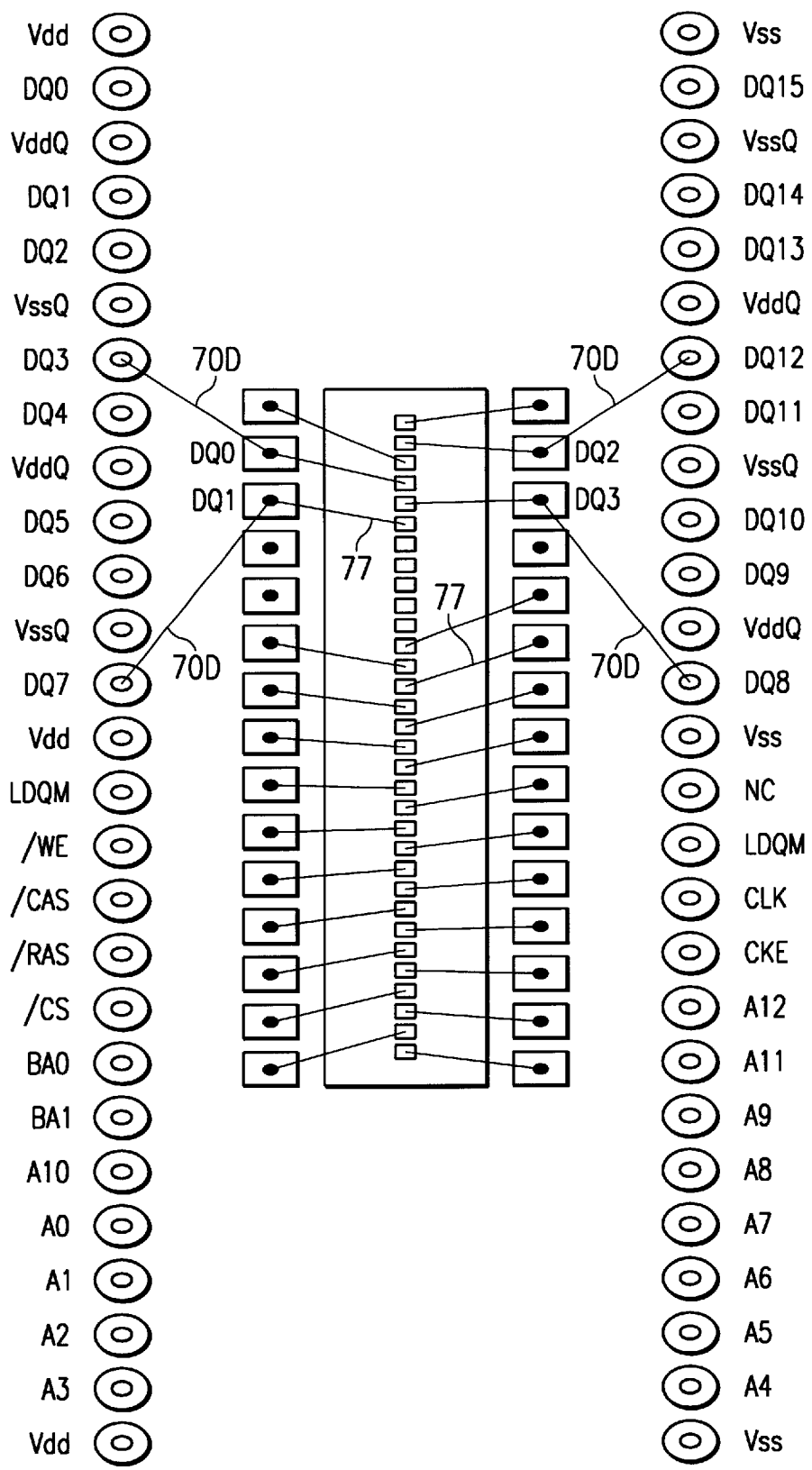
FIG. 10 is a schematic input/output routing diagram of the fourth of four 64 Mbit×4 packaged devices to be connected to a 256 Mbit×16 module according to the invention.

Applying the logic rule of exclusive OR to define the routing patterns of the conductive strips integral with the insulating carriers of the four devices, the solder ball names and routes to the contact pads for the electrical inputs/outputs have been determined as shown in FIGS. 7 to 10. In FIG. 7, the connecting routing strips are marked by reference numbers 70A, in FIG. 8 by numbers 70B, in FIG. 9 by numbers 70C, and in FIG. 10 by numbers 70D (not shown in FIGS. 7 to 10 are the remainder of the connecting routing strips, which are common in all four carriers). As in the earlier described embodiment of a two-device module, for achieving the electrical connection of the four 64 Mbit×4 devices, each having one of the carriers discussed in FIGS. 7 to 10, each terminal is connected with its respective counterpart. The result is a module of 256 Mbit memory capacity and ×16 organization (also referred to as 16 Mbyte× 16). When the electrical connection is accomplished by reflowing the respective solder balls ("stacking" of the four devices), then the resulting module is indeed of "high density"; it exhibits minimum height and occupies a board area not larger than an individual packaged memory device.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is, therefore, intended that the appended claims encompass any such modifications or embodiments.

What is claimed is:

1. A high density memory module comprising:
   a first packaged integrated circuit memory device having therein a first electrically insulating carrier and first conductive routing pattern integral with said first carrier, and at least a first semiconductor circuit chip;
   a second packaged integrated circuit memory device electrically connected to said first device, wherein said first and second devices form a module;
   said second packaged integrated circuit memory device having therein a second electrically insulating carrier and second conductive routing pattern integral with said second carrier, and at least a second semiconductor circuit chip; and
   said second conductive routing pattern including means for modifying the architectural organization of said module.

2. The high density module according to claim 1 wherein said second pattern is different from said first pattern whereby the electrical input/output of the module acquires an exclusive combination of the electrical inputs/outputs of said first and said second devices.

3. The high density module according to claim 1 wherein said second pattern is routed such that the electrical inputs/outputs of said second device are not shared by the inputs/outputs of said first device, while the remainder of the electrical signal and power terminals of said second device is shared by the signal and power terminals of said first device.

4. The high density module according to claim 1 wherein said first and second devices form a stacked module.

5. The high density module according to claim 4 wherein a space is formed between said first and said second packaged integrated circuit memory device, an exposed back surface of said first semiconductor circuit chip being disposed in said space.

6. The high density module according to claim 1 wherein said at least one semiconductor circuit chip in said second package is of the same type as said first semiconductor circuit chip in said first package.

7. The high density module according to claim 1 further comprising four packaged integrated circuit devices electrically connected.

8. The high density module according to claim 1 wherein eight packaged integrated circuit devices are electrically connected.

9. The high density module according to claim 1 wherein said first and second packaged integrated circuit devices are each further defined as comprising:
an electrically insulating carrier having first and second surfaces, an outline and an opening;
a plurality of electrically conductive routing strips integral with said carrier and extending into said opening;
said strips on the carrier of said second device being routed differently from the strips on the carrier of said first device, whereby the architectural organization of said module is modified compared to the organization of each individual device;
a plurality of contact pads disposed surrounding said opening on said first and second surfaces, at least one of said contact pads disposed on said first surface being electrically connected with at least one of said routing strips, and at least one of said contact pads disposed on said second surface being electrically connected with at least one of said routing strips;
at least one via electrically connecting at least one of said pads disposed on said first surface with at least one of said pads disposed on said second surface;
a semiconductor circuit chip adhered to said second surface of said carrier, said chip having at least one bonding pad;
bonding wires electrically connecting said at least one bonding pad to at least one of said routing strips; and
encapsulating material filling said opening to cover said bonding wires and said at least one bonding pad.

10. The integrated circuit packages according to claim 9 wherein said plurality of contact pads surrounding said opening form a single row of pads.

11. The integrated circuit packages according to claim 9 wherein said plurality of contact pads surrounding said opening form a first row of pads adjacent to one side of said opening and a second row of pads adjacent to an opposite side of said opening.

12. The integrated circuit packages according to claim 9 further including at least one bus bar integral with said carrier, said at least one bus bar electrically connected to at least one of said contact pads disposed on said first and said second surfaces of said carrier, and to at least one of said bonding pads.

13. The integrated circuit packages according to claim 9 further including at least one solder ball located on at least one of said contact pads disposed on said first surface.

14. The integrated circuit packages according to claim 9 further including at least one solder ball located on at least one of said contact pads disposed on said second surface.

15. The integrated circuit packages according to claim 9 further including at least one solder ball located on at least one of said contact pads disposed on said first surface and at least one solder ball located on at least one of said contact pads disposed on said second surface.

16. The integrated circuit packages according to claim 9 wherein said carrier further includes a cavity
and wherein said chip is adhered to said carrier in said cavity.

17. The integrated circuit packages according to claim 9 wherein solder balls rather than bonding wires electrically connect said at least one bonding pad to at least one of said routing strips.

18. A method for the fabrication of a high density memory module comprising:
providing a first packaged integrated circuit memory device having therein a first electrically insulating carrier and first conductive routing pattern integral with said first carrier, and at least a first semiconductor circuit chip;
providing a second packaged integrated circuit memory device having therein a second electrically insulating carrier and second conductive routing pattern integral with said second carrier, and at least a second semiconductor circuit chip;
connecting electrically said second device to said first device whereby said first and second devices form a module; and
structuring said second conductive routing pattern such that the electrical inputs/outputs of said second device are not shared by the inputs/outputs of said first device, while the remainder of the electrical signal and power terminals of said second device is shared by the signal and power terminals of said first device.

19. The method for fabrication according to claim 18 wherein said second conductive routing pattern is provided by applying the logic rule of exlusive OR to the electrical inputs/outputs of said
second device and said first device, respectively.

20. The method for fabrication according to claim 18 wherein said second device is electrically connected and stacked to said first device whereby a space is formed between said first and said second packaged integrated circuit memory device, an exposed back side of said first semiconductor circuit chip being disposed in said space.

21. The method for fabrication according to claim 18 wherein the step of electrical connection and stacking further includes connecting two additional packaged integrated circuit memory devices to said first and second packaged devices to form a module of four packaged devices.

22. The method for fabrication according to claim 18 wherein the step of electrical connection and stacking further includes connecting six additional packaged integrated circuit memory devices to said first and second packaged devices to form a module of eight packaged devices.

* * * * *